United States Patent
Chiu et al.

(10) Patent No.: US 9,543,410 B2
(45) Date of Patent: Jan. 10, 2017

(54) SEMICONDUCTOR DEVICE AND FORMATION THEREOF

(71) Applicant: Taiwan Semiconductor Manufacturing Company Limited, Hsin Chu (TW)

(72) Inventors: Yi-Wei Chiu, Kaohsiung (TW); Wu Meng-Chuan, Tainan (TW); Tzu-Chan Weng, Kaohsiung (TW); Li-Te Hsu, Shanhua Township (TW)

(73) Assignee: TAIWAN SEMICONDUCTOR MANUFACTURING COMPANY LIMITED, Hsin Chu (TW)

( * ) Notice: Subject to any disclaimer, the term of this patent is extended or adjusted under 35 U.S.C. 154(b) by 0 days.

(21) Appl. No.: 14/180,408

(22) Filed: Feb. 14, 2014

(65) Prior Publication Data

US 2015/0236155 A1 Aug. 20, 2015

(51) Int. Cl.
- *H01L 21/02* (2006.01)
- *H01L 29/66* (2006.01)
- *H01L 29/78* (2006.01)
- *H01L 29/08* (2006.01)
- *H01L 21/8238* (2006.01)
- *H01L 27/092* (2006.01)
- *H01L 29/165* (2006.01)

(52) U.S. Cl.
CPC . *H01L 29/66636* (2013.01); *H01L 21/823807* (2013.01); *H01L 21/823814* (2013.01); *H01L 27/092* (2013.01); *H01L 29/0847* (2013.01); *H01L 29/66628* (2013.01); *H01L 29/7834* (2013.01); *H01L 29/165* (2013.01)

(58) Field of Classification Search
CPC ............. H01L 29/66628; H01L 29/165; H01L 29/7848; H01L 29/66636; H01L 29/1083; H01L 29/66545; H01L 29/7834; H01L 29/78; H01L 29/161; H01L 29/66477; H01L 29/785; H01L 21/823412; H01L 21/82345; H01L 21/823493

USPC ........................................................ 257/408

See application file for complete search history.

(56) References Cited

U.S. PATENT DOCUMENTS

| | | | |
|---|---|---|---|
| 6,214,679 B1 * | 4/2001 | Murthy | H01L 29/41783 257/E21.165 |
| 6,600,200 B1 * | 7/2003 | Lustig et al. | 257/371 |
| 7,332,439 B2 * | 2/2008 | Lindert et al. | 438/696 |
| 7,858,481 B2 * | 12/2010 | Brask | H01L 29/42376 257/224 |

(Continued)

*Primary Examiner* — Tod T Van Roy
*Assistant Examiner* — Vu A Vu
(74) *Attorney, Agent, or Firm* — Cooper Legal Group, LLC

(57) ABSTRACT

A semiconductor device and method of forming the same are described. A semiconductor device includes an active area adjacent a gate structure. The gate structure includes a gate electrode over a gate dielectric, the gate dielectric having a bottom surface in a first plane. A second etch interacts with a first composition and an initial dopant to remove a bottom portion of a first sidewall spacer adjacent the gate structure, such that a bottom surface of the first sidewall spacer lies in a second plane different than the first plane. The removal of the bottom portion of the first sidewall spacer reduces a first distance between a source or drain and a bottom surface of the gate electrode, thus reducing proximity loading of the semiconductor device and improving functionality of the semiconductor device.

20 Claims, 6 Drawing Sheets

(56) References Cited

U.S. PATENT DOCUMENTS

| | | | |
|---|---|---|---|
| 8,598,003 B2* | 12/2013 | Murtthy | H01L 21/02057 257/E21.431 |
| 2007/0152266 A1* | 7/2007 | Doyle | H01L 29/66545 257/327 |
| 2011/0024801 A1* | 2/2011 | Cheng | H01L 29/165 257/255 |
| 2012/0001238 A1* | 1/2012 | Tsai et al. | 257/255 |
| 2013/0109144 A1* | 5/2013 | Kim | H01L 21/02532 438/301 |
| 2014/0335674 A1* | 11/2014 | Liao | H01L 29/66636 438/285 |

* cited by examiner

SEMICONDUCTOR DEVICE AND FORMATION THEREOF

BACKGROUND

In a semiconductor device, such as a transistor, current flows through a channel region between a source region and a drain region upon application of a sufficient voltage or bias to a gate of the device. When current flows through the channel region, the transistor is generally regarded as being in an 'on' state, and when current is not flowing through the channel region, the transistor is generally regarded as being in an 'off' state.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
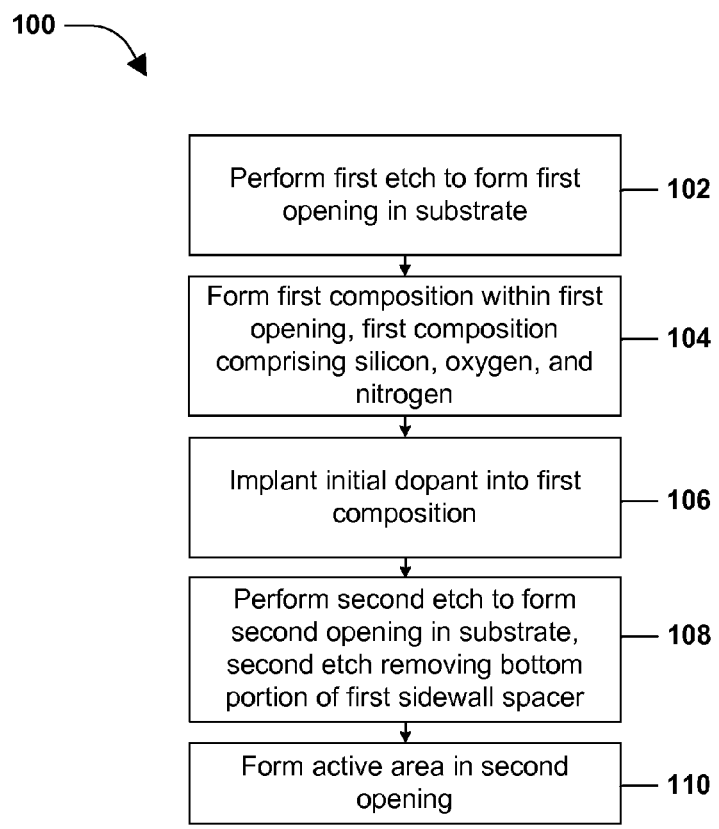
FIG. 1 is a flow diagram illustrating a method of forming a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor device and resulting structures formed thereby are provided herein.

Figure 9:
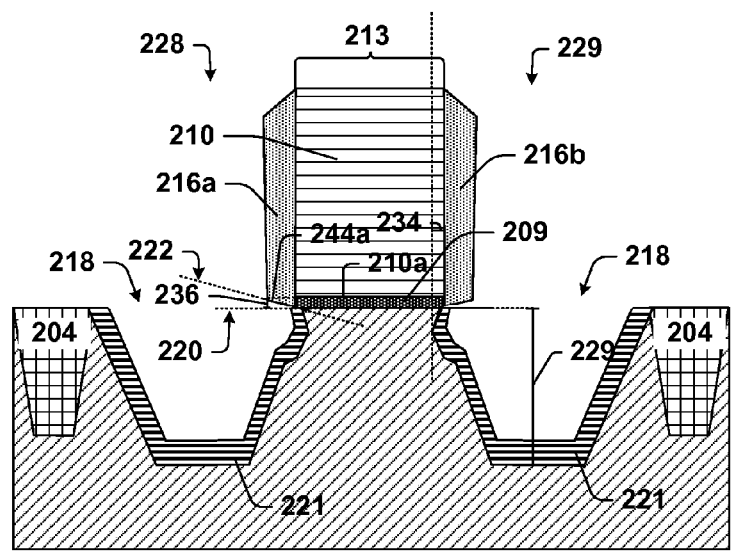
FIG. 9 is an illustration of a semiconductor device, in accordance with some embodiments.
Figure 10:
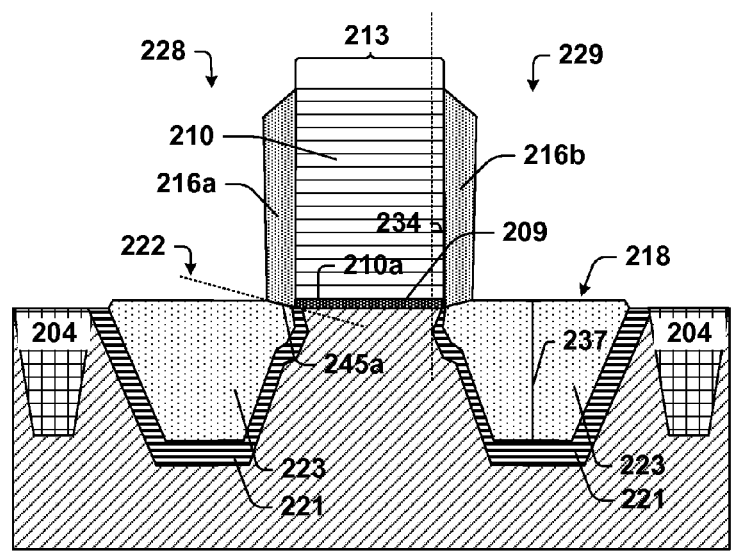
FIG. 10 is an illustration of a semiconductor device, in accordance with some embodiments.
Figure 11:
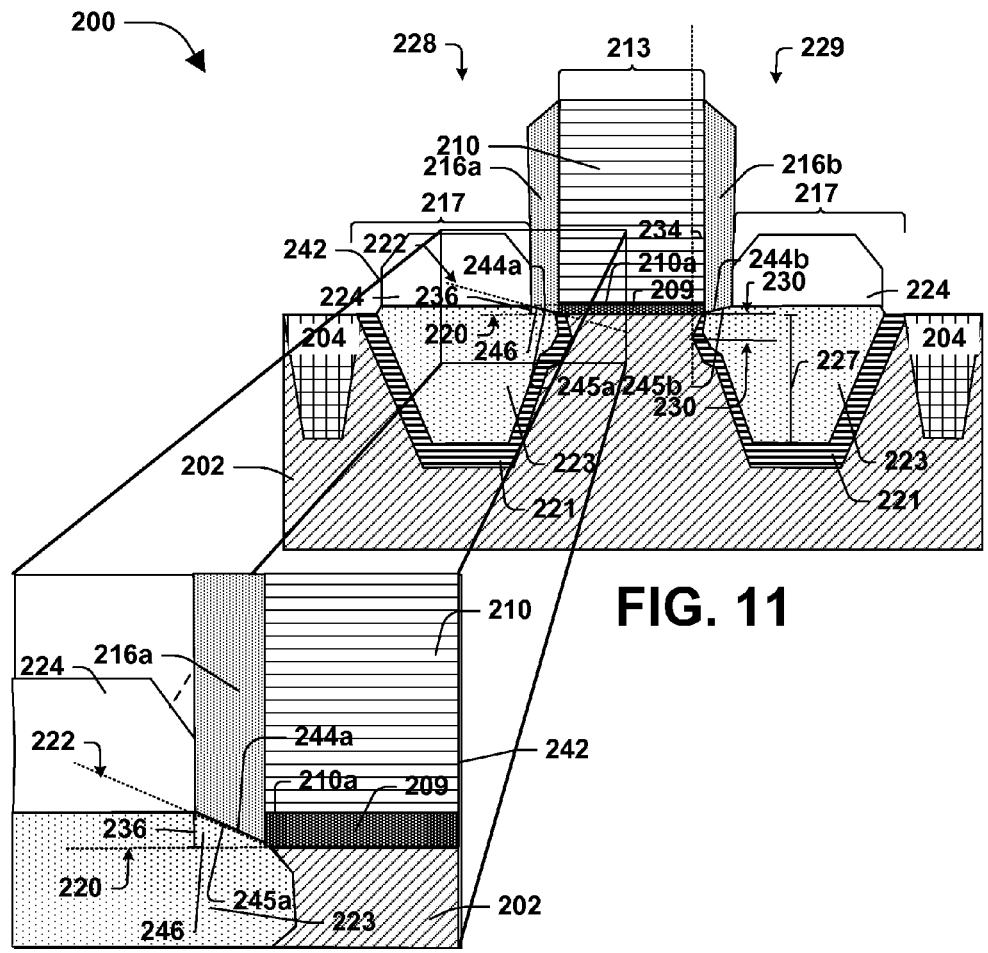
FIG. 11 is an illustration of a semiconductor device, in accordance with some embodiments.

A method 100 of forming a semiconductor device 200 according to some embodiments is illustrated in FIG. 1 and one or more structures formed thereby at various stages of fabrication are illustrated in FIGS. 2-12. According to some embodiments, a semiconductor device 200 comprises an active area 217 in a substrate 202 adjacent a gate structure 213, as illustrated in FIG. 11. In some embodiments, the active area 217 comprises at least one of a source or a drain. In some embodiments, the gate structure 213 comprises a gate dielectric 209 in contact with the substrate 202, a bottom surface of the gate dielectric 209 lying within a first plane 220. In some embodiments, a gate electrode 210 is over the gate dielectric 209. In some embodiments, a first sidewall spacer 216a is on a first side 228 of the gate structure 213. In some embodiments, a second sidewall spacer 216b is on a second side 229 of the gate structure 213. In some embodiments, the first sidewall spacer 216a has a first sidewall spacer bottom surface 244a lying with in a second plane 222, where the first plane 220 is different than the second plane 222. In some embodiments, the active area 217 comprises a first active area layer 221 having a first dopant concentration, a second active area layer 223 having a second dopant concentration, the second active area layer 223 over the first active area layer 221, and a third active area layer 224 having a third dopant concentration, the third active area layer 224 over the second active area layer 223, and over a top surface of the substrate 202. In some embodiments, the first dopant concentration, the second dopant concentration and the third dopant concentration of the active area 217 comprises at least one of a first conductivity type or a second conductivity type. In some embodiments, the first conductivity type is at least one of a p-type or an n-type. In some embodiments, the second conductivity type is p-type if the first conductivity type is n-type and the second conductivity type is n-type if the first conductivity type is p-type. In some embodiments, the second active area layer 223 has a first tip portion 246, the first tip portion 246 having a first tip portion top surface 245a. In some embodiments, the first tip portion top surface 245a lies within the second plane 222. In some embodiments, the first tip portion 246 is separated a first distance 236 from the bottom surface 210a of the gate electrode 210. In some embodiments, the first distance 236 is less than about 2 nm.

Figure 2:
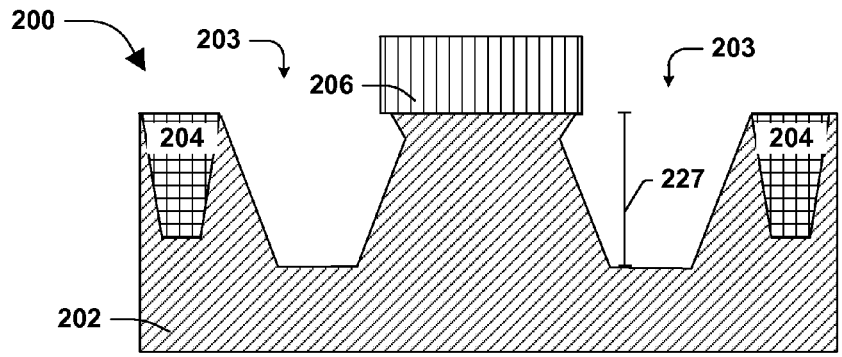
FIG. 2 is an illustration of a semiconductor device, in accordance with some embodiments.
Figure 5:
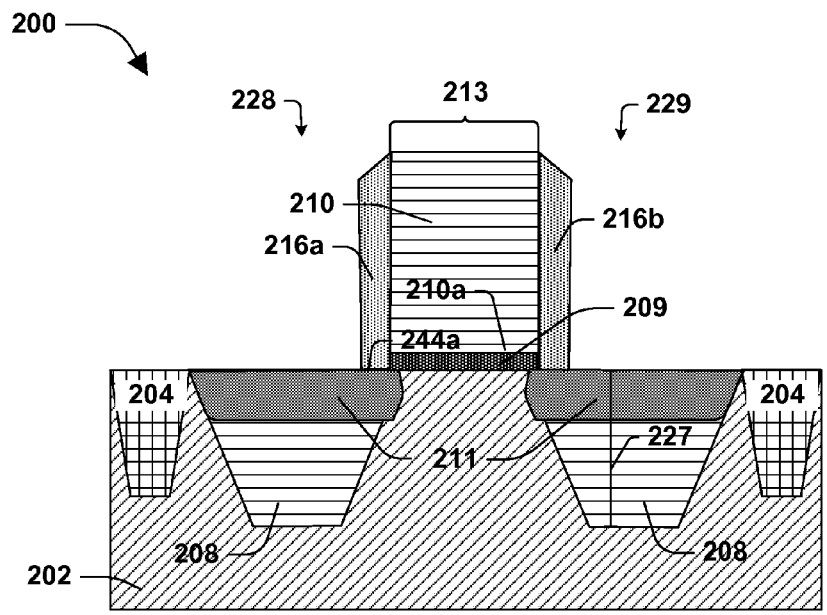
FIG. 5 is an illustration of a semiconductor device, in accordance with some embodiments.

At 102, a first etch is performed to form a first opening 203 in the substrate 202, where a couple of instances of the first opening are illustrated in FIG. 2, according to some embodiments. In some embodiments, the first opening 203 is formed in the substrate 202 between shallow trench isolation (STI) areas 204. In some embodiments, the substrate 202 comprises silicon. According to some embodiments, the substrate 202 comprises at least one of an epitaxial layer, a silicon-on-insulator (SOI) structure, a wafer, or a die formed from a wafer. In some embodiments, the STI area 204 comprises a dielectric material, such as silicon oxide ($SiO_2$). In some embodiments, a photoresist 206 is formed over the substrate 202 and patterned prior to the first etch. In some embodiments, the gate structure 213, as shown in FIG. 5, is formed over the substrate 202 prior to the first etch. In some embodiments, the gate structure 213 is formed by forming a gate dielectric layer comprising a high dielectric constant material, such as an oxide, over the substrate 202. In some embodiments, a gate electrode material is formed over the gate dielectric layer, and the gate electrode material and the gate dielectric layer are patterned, such that the gate electrode material is patterned to form the gate electrode 210 and the gate dielectric layer is patterned to form the gate dielectric 209. In some embodiments, the gate electrode 210 has a gate electrode bottom surface 210a, where the gate electrode bottom surface 210a lies in a plane above the first plane 220, as illustrated in FIG. 11. In some embodiments, the gate electrode 210 comprises at least one of a metal or a polysilicon. In some embodiments, the gate structure 213 comprises a hard mask (not shown) over the gate electrode 210. In some embodiments, the first opening 203 is formed by a first etchant, the first etchant comprising at least one of ($NH_4$)F or (($NH_4$)F)(HF). In some embodiments, the first opening 203 is adjacent the gate structure 213. In some embodiments, the first opening 203 has a first height 227 between about 25 nm to about 60 nm, as illustrated in FIG. 2. In some embodiments, the first opening 203 comprises at least one of a triangular or convex quadrilateral shape.

Figure 3:
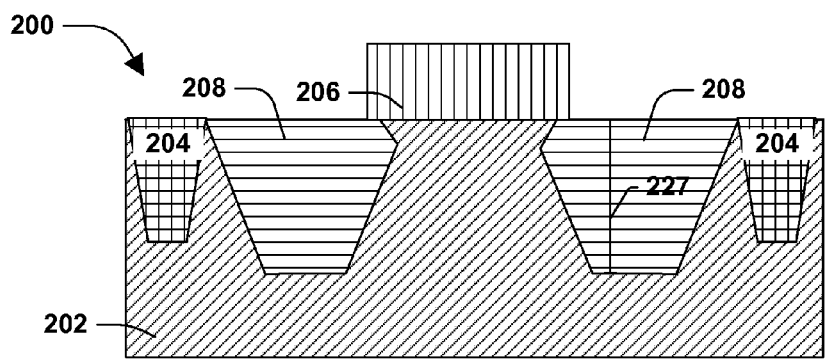
FIG. 3 is an illustration of a semiconductor device, in accordance with some embodiments.

At 104, a first composition 208 is formed in the first opening 203, as illustrated in FIG. 3, according to some embodiments. In some embodiments, the first composition 208 comprises silicon, oxygen and nitrogen. In some embodiment, the first composition 208 is at least one of grown or deposited. In some embodiment, the first composition 208 is formed concurrently with the first etch. In some embodiment, the first composition 208 is formed after the first etch. In some embodiments, the first composition 208 is formed in a chamber. In some embodiments, the first etch is performed in the chamber. In some embodiments, the first composition 208 is formed by introducing a nitrogen precursor, an oxygen precursor and a silicon precursor into the chamber. In some embodiments, the first composition 208 is formed by introducing a first gas comprising at least one of Ar, $H_2$, $N_2$, He or $NH_3$ into the chamber at a first flow rate of about 1 sccm to about 1000 sccm. In some embodiments, the chamber is at first temperature of about 50° C. to about 800° C. In some embodiments, the chamber is at a first pressure of about 0.5 Torr to about 760 Torr.

Figure 4:
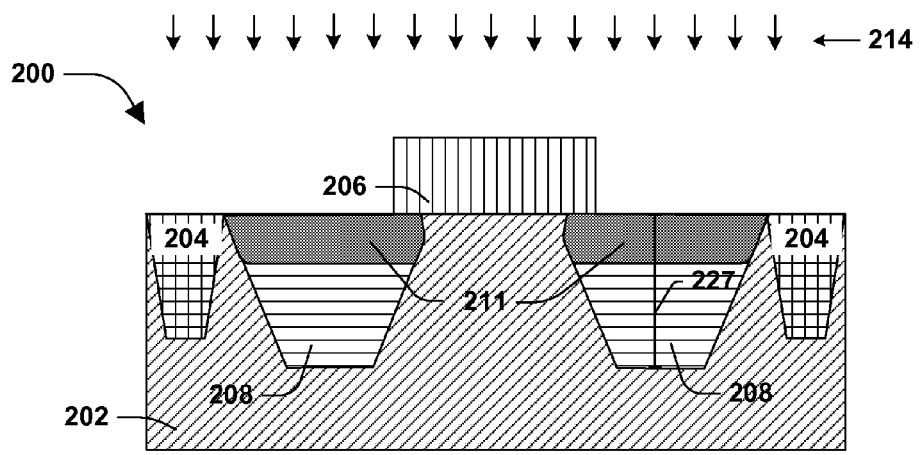
FIG. 4 is an illustration of a semiconductor device, in accordance with some embodiments.
Figure 6:
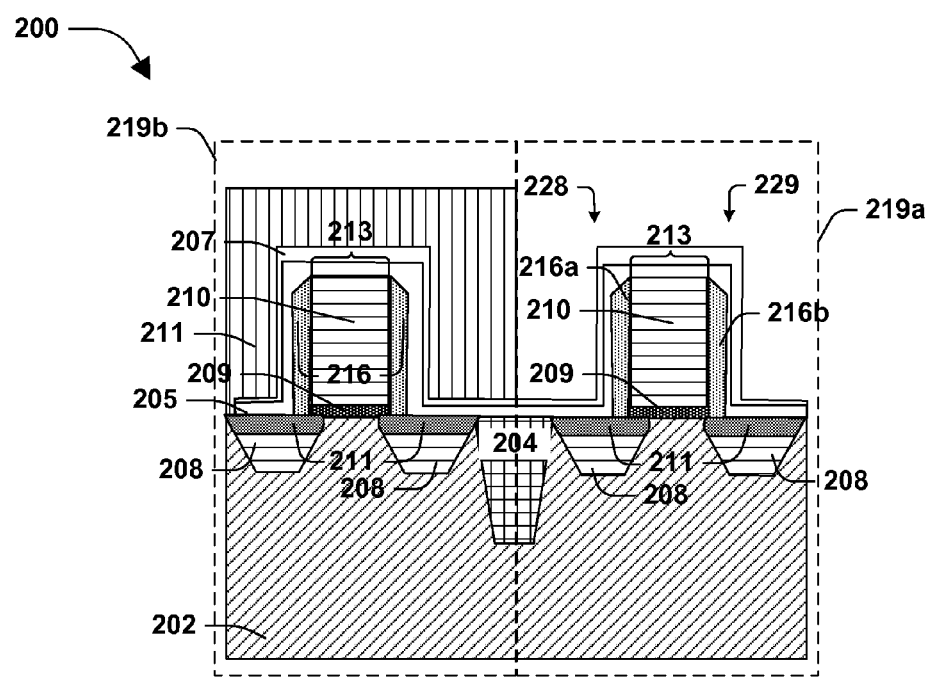
FIG. 6 is an illustration of a semiconductor device, in accordance with some embodiments.
Figure 7:
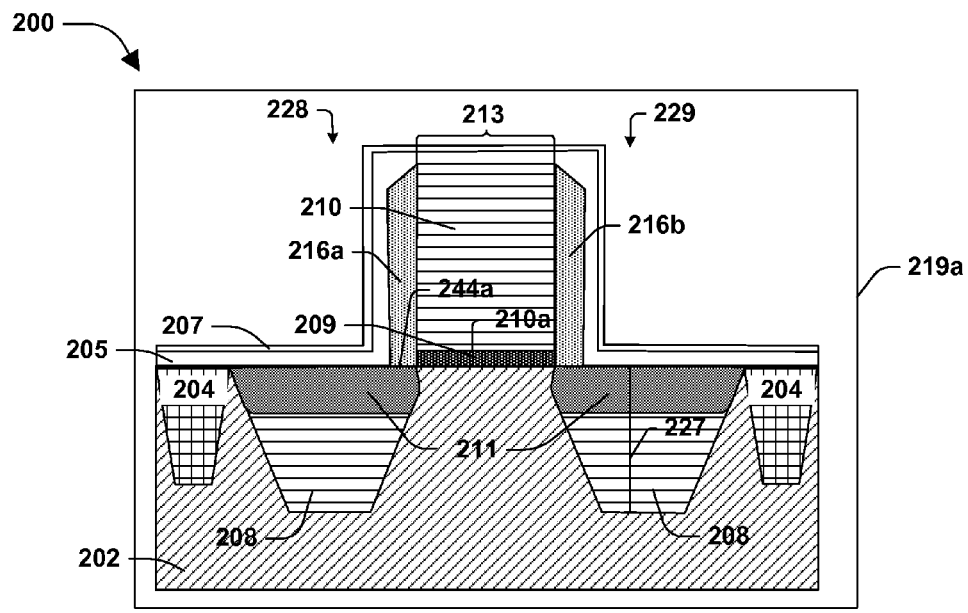
FIG. 7 is an illustration of a semiconductor device, in accordance with some embodiments.

At 106, an initial dopant 214 is implanted into the first composition 208, as illustrated in FIG. 4, according to some embodiments. In some embodiments, the initial dopant 214 is implanted to form a halo region 211. In some embodiments, where a photoresist 206 is formed prior to the first etch, rather than the gate structure 213, the photoresist 206 is removed and the gate structure 213, as illustrated in FIG. 5, is formed, as described above, prior to the initial dopant 214 being implanted. In some embodiments, the initial dopant 214 comprises arsenic (As). In some embodiments, the initial dopant 214 comprises at least one of the first conductivity type or the second conductivity type. In some embodiments, the implant comprises a dose between about 1 $e^{14}$ atoms/$cm^2$ to about 1 $e^{15}$ atoms/$cm^2$ of the initial dopant at an energy of between about 5 keV to about 20 keV. In some embodiments, an anneal is performed on the semiconductor device 200. In some embodiments, the anneal comprises applying a first temperature between about 400° C. to about 1000° C. to the semiconductor device 200 for a first duration between about 10 sec to about 60 min. In some embodiments, the anneal expands the halo region 211 by activating the initial dopant 214, such that the initial dopant 214 migrates further into a channel region under the gate structure 213. In some embodiments, where a photoresist 206 is formed prior to the implantation of the initial dopant 214, rather than the gate structure 213, the photoresist 206 is removed and the gate structure 213, as illustrated in FIG. 5, is formed, as described above, after the initial dopant 214 is implanted. In some embodiments, the first sidewall spacer 216a is formed on the first side 228 of the gate structure 213, as illustrated in FIG. 5. In some embodiments, the second sidewall spacer 216b is formed on the second side 229 of the gate structure 213. In some embodiments, the first sidewall spacer 216a and the second sidewall spacer 216b comprise nitride. In some embodiments, at least one of the first sidewall spacer 216a or the second sidewall spacer 216b have a first width between about 2 nm to about 12 nm. In some embodiments, such as where there are multiple adjacent transistors, as illustrated in FIG. 6, a first transistor 219a is formed as at least one of a p-FET or an n-FET and a second transistor 219b is formed as an n-FET where the first transistor 219a is a p-FET or the second transistor 219b is formed as a p-FET where the first transistor 219a is an n-FET. In some embodiments, the first transistor 219a and the second transistor 219b are formed in substantially the same manner as described above with regards to the method 102-106. In some embodiments, an oxide layer 205 is formed, such as by deposition, over the first transistor 219a and the second transistor 219b. In some embodiments, a nitride layer 207 is formed, such as by growth, over the oxide layer 205. In some embodiments, a transistor photoresist 211 is formed on the surface of the nitride layer 207 over the second transistor 219b. In some embodiments, the transistor photoresist 211 protects the second transistor 219b from subsequent processing that occurs with respect to the first transistor 219a. Such subsequent processing is illustrated in FIGS. 7-11, according to some embodiments.

Figure 8:
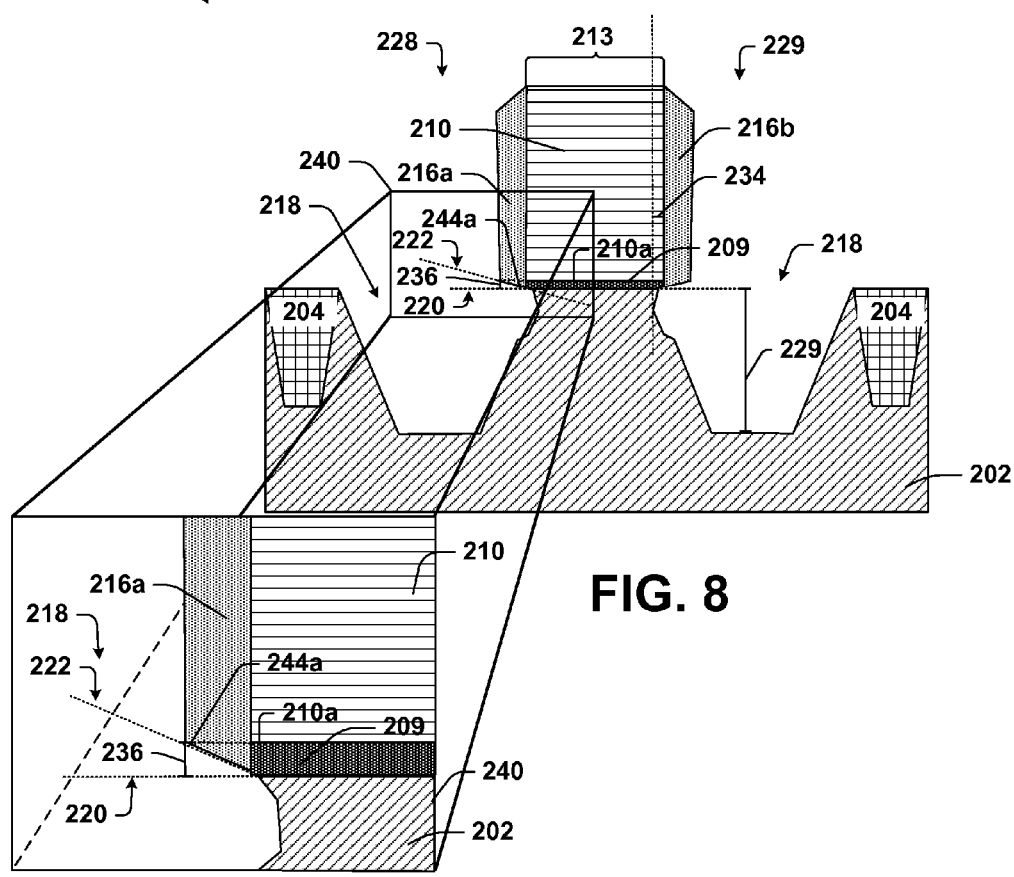
FIG. 8 is an illustration of a semiconductor device, in accordance with some embodiments.

At 108, a second etch is performed to form a second opening 218 in the substrate 202, such that the first composition 208 and all or substantially all of the halo implant 211 are removed, as illustrated in FIG. 8, according to some embodiments. In some embodiments, the second etch removes the oxide layer 205 and the nitride layer 207. In some embodiments, the second etch comprises a second etchant, such as $Cl_2$ or $O_2$. In some embodiments, the second etch is performed in a chamber. In some embodiments, the chamber is at second temperature between about 200° C. to about 600° C. In some embodiments, the chamber is at a second pressure between about 0.1 Torr to about 100 Torr. In some embodiments, the second etch removes a bottom portion of the first sidewall spacer 216a such that a first sidewall spacer bottom surface 244a of the first sidewall spacer 216a lies within the second plane 222, where, the second plane 222 is different than the first plane 220. According to some embodiments, a box 240 illustrates a zoomed in or magnified view of portions of the first sidewall spacer 216a, the gate electrode 210, the gate dielectric 209 and the substrate 202. In some embodiments, the first plane 220 is the first distance 236 from the bottom surface 210a of gate electrode 210. In some embodiments, the second opening 218 has a second height 229 between about 25 nm to about 60 nm. In some embodiments, the second etch similarly removes a bottom portion of the second sidewall spacer 216b. In some embodiments, the second etch forms the second opening 218, such that the second opening 218 is partially under the gate structure 213 and extends under the gate structure 213. In some embodiments, the second opening 218 comprises at least one of a triangular or convex quadrilateral shape. In some embodiments, the second opening 218 is a second distance 234 under the gate structure 213, where the second distance 234 is between about 2 nm to about 10 nm.

Figure 12:
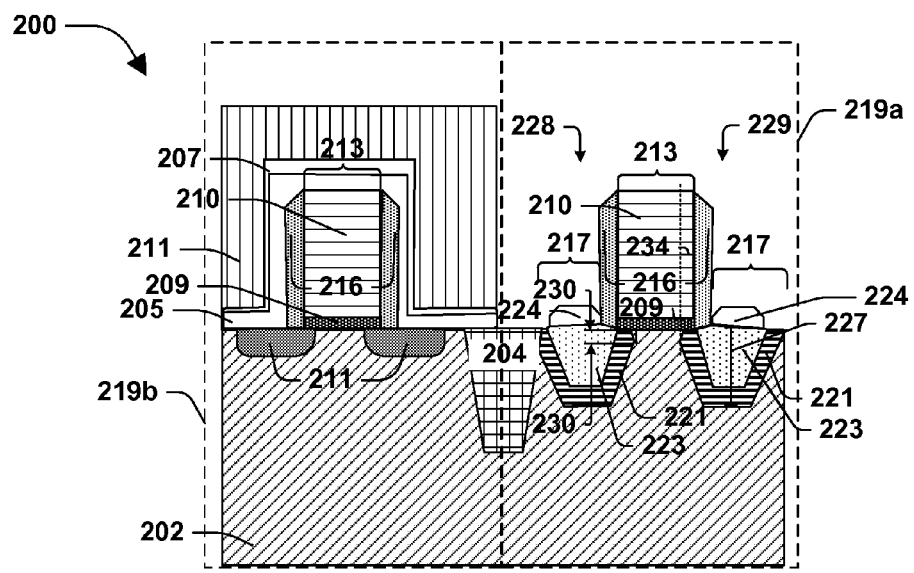
FIG. 12 is an illustration of a semiconductor device, in accordance with some embodiments.

At 110, the active area 217 is formed in the second opening 218, as illustrated in FIG. 11, according to some embodiments. Turning to FIG. 9, prior to FIG. 11, the first active area layer 221 having the first dopant concentration is formed in the second opening 218. In some embodiments, the first active area layer 221 comprises at least one of silicon or germanium. In some embodiments, the first dopant concentration comprises between about 10% to about 20% of the first dopant, where the first dopant is at least one of the first conductivity type or the second conductivity type. In some embodiments, the first active area layer 221 is grown, such as by epitaxial growth in the second opening 218. In some embodiments, the first active area layer 221 is grown conformally to the second opening 218. In some embodiments, the first active area layer 221 has a uniform thickness. In some embodiments, the first active area layer 221 does not have a uniform thickness. In some embodiments, the first active area layer 221 has a thickness between about 10 nm to about 30 nm. In some embodiments, the first active area layer 221 extends under the gate structure 213. In some embodiments, the first active area layer 221 is the second distance 234 under the gate structure 213, where the second distance is between about 2 nm to about 10 nm. In some embodiments, the first active area layer 221 has a first active area depth 229, as measured from the bottom most bottom surface of the first active area layer 221 to a top surface of the substrate 202. In some embodiments, the second active area layer 223 having the second dopant concentration is formed over the first active area layer 221 in the second opening 218, as illustrated in FIG. 10. In some embodiments, the second active area layer 223 comprises at least one of silicon or germanium. In some embodiments, the second dopant concentration is greater than the first dopant concentration. In some embodiments, the second dopant concentration comprises between about 15% to about 35% of the second dopant, where the second dopant is at least one of the first conductivity type or the second conductivity type. In some embodiments, the second active area layer 223 is grown, such as by epitaxial growth, in the presence of the second dopant in the second opening 218 over the first active area layer 221. In some embodiments, the second active area layer 223 is grown such that the second active area layer 223 exceeds the height of the second opening 218 and thus extends above the top surface of the substrate. In some embodiments, the second active area layer 223 has a first tip portion 246 having the first tip portion top surface 245a, as illustrated in FIG. 11. In some embodiments, the first tip portion top surface 245a lies within the second plane 222. In some embodiments, the first tip portion 246 is separated the first distance 236 from the bottom surface 210a of the gate electrode 210. In some embodiments, the first distance 236 is less than about 2 nm. In some embodiments, the third active area layer 224 having a third dopant concentration is formed over the second active area layer 223 and above the substrate 202, as illustrated in FIG. 11. According to some embodiments, a box 242 illustrates a zoomed in or magnified view of portions of the first sidewall spacer 216a, the gate electrode 210, the gate dielectric 209, the second active area layer 223, the third active area layer 224 and the substrate 202. In some embodiments, the active area 217 comprises the first active area layer 221, the second active area layer 223, and the third active area layer 224. In some embodiments, the third active area layer 224 comprises at least one of silicon or germanium. In some embodiments, the third dopant concentration is greater than the second dopant concentration. In some embodiments, the third dopant concentration comprises greater than 30% of the third dopant, where the second dopant is at least one of the first conductivity type or the second conductivity type. In some embodiments, the third active area layer 224 is grown, such as by epitaxial growth, in the presence of the third dopant, over the second active area layer 223 and above a top surface of the substrate 202, such that the third active area layer 224 is adjacent the gate structure 213. In some embodiments, the third active area layer 224 is grown such that the third active area layer 224 is on a top surface of the second active area layer 223 and the first active area layer 221. In some embodiments, the third active area layer 224 is patterned, such that the third active area layer 224 is on the top surface of the second active area layer 223 and not a top surface of the first active area layer 221. In some embodiments, the active area 217 comprises at least one of a source or a drain. Turning to FIG. 12, an illustration of the semiconductor device 200 is shown. In some embodiments, the first transistor 219a that is in a final stage or substantially final stage of formation is adjacent the second transistor 219b, which is in an intermediate stage of formation. In some embodiments, the first distance 236, illustrated in FIG. 11, is controlled, such that the distance between the gate electrode bottom surface 210a is altered depending on the desired structure and function of the transistor. In some embodiments, controlling the first distance 236, such that the first distance 236 remains less than about 2 nm, reduces proximity loading of the semiconductor device 200, as compared to a device that has a greater than 2 nm first distance.

According to some embodiments, a semiconductor device comprises an active area, the active area having a first tip portion of a second active area layer. In some embodiments, the first tip portion is separated a first distance from a gate electrode bottom surface of a gate electrode of the semiconductor device. In some embodiments, the first distance less than about 1 nm.

According to some embodiments, a method of forming a semiconductor device comprises performing a first etch to form a first opening in a substrate and forming a first composition within the first opening. In some embodiments, the first composition comprises silicon, oxygen and nitrogen. According to some embodiments, the method of forming a semiconductor device further comprises implanting an initial dopant into the first composition, the initial dopant having a first conductivity type, performing a second etch to form a second opening in the substrate, the second etch removing a bottom portion of a first sidewall spacer, and forming an active area in the second opening.

According to some embodiments, a semiconductor device comprises a gate structure, a first sidewall spacer adjacent a first side of the gate structure, a first sidewall spacer bottom surface of the first sidewall spacer lying within a second plane, the second plane different than the first plane and an active area. According to some embodiments, the gate structure comprises a gate dielectric, a gate dielectric bottom surface of the gate dielectric lying within a first plane and a gate electrode over the gate dielectric.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor device comprising:
   an active area comprising:
      a first active area layer comprising a first dopant concentration; and
      a second active area layer over the first active area layer and comprising a second dopant concentration; and
      a third active area layer over the second active area layer and comprising a third dopant concentration, wherein:
         the third active area layer extends above a top surface of a substrate within which the first active area layer and the second active area layer are formed;
         the first dopant concentration is less than the second dopant concentration;
         the second dopant concentration is less than the third dopant concentration;
         a sidewall of the second active area layer is in contact with a sidewall of the first active area layer; and
         the second active area layer has a first tip portion separated a first distance from a gate electrode bottom surface of a gate electrode of the semiconductor device, the first distance less than about 1 nm.

2. The semiconductor device of claim 1, comprising:
   a gate structure comprising:
      a gate dielectric having a gate dielectric bottom surface that interfaces the substrate at an interface lying within a first plane; and
      the gate electrode over the gate dielectric; and
   a first sidewall spacer in contact with a first side of the gate structure, a first sidewall spacer bottom surface of the first sidewall spacer lying within a second plane, the second plane not parallel to the first plane.

3. The semiconductor device of claim 2, a first tip portion top surface of the first tip portion lying within the second plane.

4. The semiconductor device of claim 1, the active area comprising at least one of silicon or germanium.

5. The semiconductor device of claim 2, wherein the second plane intersects the first plane at a location where the first sidewall spacer bottom surface abuts a first side of the gate dielectric.

6. A semiconductor device comprising:
   a gate structure comprising:
      a gate dielectric, a gate dielectric bottom surface of the gate dielectric lying within a first plane; and
      a gate electrode over the gate dielectric;
   a first sidewall spacer adjacent a first side of the gate structure, wherein:
      a first sidewall spacer bottom surface of the first sidewall spacer lies within a second plane different than the first plane; and
      the first sidewall spacer bottom surface abuts the gate dielectric; and
   an active area comprising:
      a first active area layer having a first dopant concentration;

a second active area layer having a second dopant concentration, the second active area layer over the first active area layer; and a third active area layer having a third dopant concentration, the third active area layer over the second active area layer and extending above a top surface of a substrate within which the first active area layer and the second active area layer are formed, where the first dopant concentration is less than the second dopant concentration, and the second dopant concentration is less than the third dopant concentration.

7. The semiconductor device of claim 6, the second active area layer having a first tip portion, a first tip portion top surface of the first tip portion lying within the second plane.

8. The semiconductor device of claim 7, the first tip portion separated a first distance from a gate electrode bottom surface of the gate electrode, the first distance less than about 1 nm.

9. The semiconductor device of claim 6, the substrate comprising silicon.

10. The semiconductor device of claim 6, the active area comprising at least one of silicon or germanium.

11. A semiconductor device comprising:
a gate structure comprising:
a gate dielectric having a bottom surface that interfaces an underlying substrate at an interface lying within a first plane; and
a gate electrode over the gate dielectric; and
a first sidewall spacer in contact with the gate electrode and having a bottom surface lying within a second plane intersecting the first plane, wherein the second plane intersects the first plane at a location where the bottom surface of the first sidewall spacer abuts a first side of the gate dielectric; and
an active area comprising:
a first active area layer vertically co-planar with the gate dielectric and having a first dopant concentration;

a second active area layer above the first active area layer and having a second dopant concentration different than the first dopant concentration; and a third active area layer above the second active area layer, the third active area layer having a third dopant concentration different than the second dopant concentration and different than the first dopant concentration.

12. The semiconductor device of claim 11, the first dopant concentration less than the second dopant concentration.

13. The semiconductor device of claim 11, the first dopant concentration less than the second dopant concentration and the second dopant concentration less than the third dopant concentration.

14. The semiconductor device of claim 11, the second active area layer and the third active area layer in contact with the first sidewall spacer.

15. The semiconductor device of claim 11, the second active area layer in contact with the bottom surface of the first sidewall spacer.

16. The semiconductor device of claim 11, wherein the first active area layer interfaces with the gate dielectric at the first plane.

17. The semiconductor device of claim 11, wherein the second active area layer is in contact the first active area layer.

18. The semiconductor device of claim 11, wherein the third active area layer is in contact with the second active area layer.

19. The semiconductor device of claim 11, wherein the third active area layer interfaces the second active area layer at a second interface lying in a third plane, the third plane intersecting the second plane at a location where the first sidewall spacer abuts the second active area layer.

20. The semiconductor device of claim 11, the active area comprising at least one of silicon or germanium.

* * * * *